(12) United States Patent
Barkaröet al.

(10) Patent No.: US 6,728,366 B1
(45) Date of Patent: Apr. 27, 2004

(54) SIGNAL LEVEL ADJUSTMENT ARRANGEMENT

(75) Inventors: Stefan Barkarö, Solna (SE); Albin Johansson, Haninge (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 626 days.

(21) Appl. No.: 09/717,120

(22) Filed: Nov. 22, 2000

(30) Foreign Application Priority Data

Nov. 23, 1999 (SE) ............................................... 9904238

(51) Int. Cl.[7] .............................. H04M 3/00; H04M 7/00
(52) U.S. Cl. ...................... 379/347; 379/395; 379/414; 375/231; 375/297; 375/345
(58) Field of Search ..................... 379/347, 387.02, 379/392.01, 395, 395.01, 414, 417; 375/219, 222, 231, 254, 297, 345

(56) References Cited

U.S. PATENT DOCUMENTS

| | | | |
|---|---|---|---|
| 4,688,245 A | 8/1987 | Schenk | 379/410 |
| 5,568,064 A | 10/1996 | Beers et al. | 326/31 |
| 5,678,198 A * | 10/1997 | Lemson | 455/67.11 |
| 6,289,044 B1 * | 9/2001 | Velez et al. | 375/222 |
| 6,487,241 B1 * | 11/2002 | Cole | 375/220 |
| 6,507,606 B2 * | 1/2003 | Shenoi et al. | 375/211 |
| 6,512,472 B1 * | 1/2003 | Smith et al. | 341/155 |

FOREIGN PATENT DOCUMENTS

| | | | |
|---|---|---|---|
| JP | 8335878 | 12/1996 | ............ H03M/1/10 |
| WO | WO93/00751 | 1/1993 | ............ H04B/1/10 |
| WO | WO99/67880 | 12/1999 | ............ H03H/3/00 |

* cited by examiner

Primary Examiner—Binh Tieu

(57) ABSTRACT

For signal level adjustment of a multitone signal received over a transmission line (1) during a training sequence in a DSL system, a programmable high-pass filter (2) is connected to the transmission line (1). A programmable gain control unit (4) is connected between the filter (2) and an A/D converter (5). A digital signal processor (6) is connected with its inputs to the A/D converter (5), with control outputs (7, 9) to control inputs (8, 10) of the filter (2), and with control outputs (11, 13) to control inputs (12, 14) of the gain control unit (4). The processor (6) detects signal level differences between the highest and the lowest tone of the multitone signal and programs the filter (2) to make the signal levels of the highest and the lowest tone equal. The processor (6) furthermore programs the gain control unit (4) to adjust its total signal output level to coincide with the dynamic range of the A/D converter (5)

2 Claims, 1 Drawing Sheet

SIGNAL LEVEL ADJUSTMENT ARRANGEMENT

TECHNICAL FIELD

The invention relates generally to digital subscriber line systems and more specifically to an arrangement for signal level adjustment of multitone signals in such systems.

BACKGROUND OF THE INVENTION

In digital subscriber line (DSL) systems, analog signals are communicated between central offices and subscriber's premises over standard telephone lines.

In e.g. asymmetric digital subscriber line (ADSL) systems, the analog signals are multitone signals comprising up to 255 tones with a separation of 4.3 kHz.

According to standards regulating ADSL systems, the transmitted maximum power spectral density (PSD) is specified as a constant value, i.e. it is the same for all tones or frequencies.

However, a transmitted signal will be damped over the telephone line before it reaches the other side. Moreover, the damping will vary with frequency such that tones at lower frequencies will be damped less than tones at higher frequencies. Also, the damping will vary with the length of the telephone line such that a longer telephone line will damp the signal more than a shorter telephone line.

Thus, even if the transmitted PSD is regulated by the standard to be constant, the PSD of the received signal at the receiving side will vary with frequency.

The bit rate of an ADSL link is the sum of the bits allocated to each individual tone divided by the frame time, which is regulated by standard to be 246.3 $\mu$sec. It is permissible to allocate up to 15 bits per tone. The actual number of bits that can be used in practice on a tone is decided during a so-called "training sequence" that is started when an ADSL modem is powered up. During the training sequence, the far end side sends a predefined pattern with a constant PSD, while the receiving side calculates the signal-to-noise ratio (SNR) for each incoming tone. The number of bits that can be used on each tone, is then calculated by an algorithm that can be approximated by $$SNR > 3N + 9.6 + Gm + Gc,$$

where N is the number of bits allocated to a tone, and Gm and Gc are constants.

This means that the higher the SNR is in the receiver, the more bits can be allocated to a tone.

The noise level in a receiver is usually approximately a white noise, i.e. a constant PSD for all frequencies, and often decided by an A/D converter in the receive path.

Since the receiver noise floor is approximately white and the received signal varies a lot with frequency, fewer bits can be allocated to tones at higher frequencies compared to tones at lower frequencies due to a lower SNR.

SUMMARY OF THE INVENTION

The object of the invention is to increase the bit rate in a multitone DSL system without changing the standard while still meeting the standard.

This is attained in accordance with the invention by means of a programmable filter in the receive path that boosts higher frequencies more than lower frequencies.

By the use of the programmable filter, it will be possible to obtain a flat PSD for the received signal during the training sequence.

BRIEF DESCRIPTION OF THE DRAWING

The invention will be described more in detail below with reference to the appended drawing, on which the single FIGURE shows an embodiment of an arrangement according to the invention for signal level adjustment of a multitone signal received over a transmission line.

DESCRIPTION OF THE INVENTION

Figure 1:
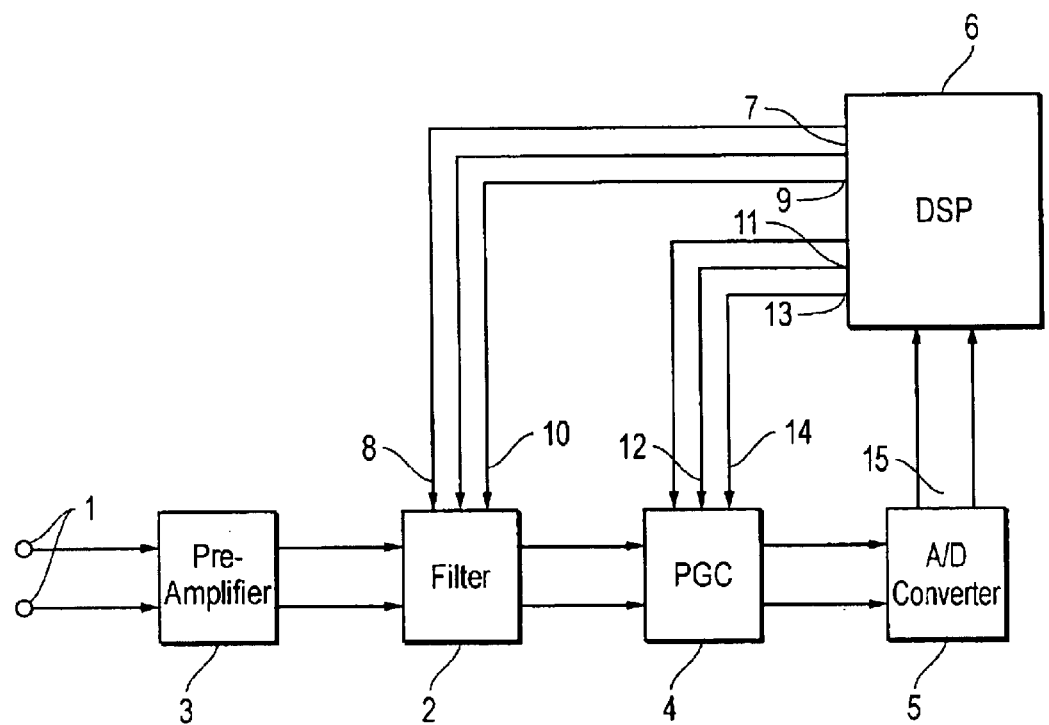

The drawing is a schematic block diagram of an arrangement according to the invention for signal level adjustment of a multitone signal received over a transmission line 1 in a DSL system, e.g. an ADSL system.

In the embodiment illustrated, the transmission line 1 is connected to an input of a programmable high-pass filter 2 via a preamplifier 3. It should be pointed out that the preamplifier 3 is not necessary in all applications, but the transmission line 1 can be directly connected to the input of the high-pass filter 2. The programmable high-pass filter 2 can be any known such filter.

The output of the filter 2 is connected to an input of a programmable gain control (PGC) unit 4 the output of which is connected to an input of an analog-to-digital (A/D) converter 5. The PGC unit 4 can be any known such unit.

An output signal bus 15 of the A/D converter 5 is connected to a set of inputs of a digital signal processor (DSP) 6, having a set of control outputs 7 connected to a set of control inputs 8 of the filter 2, an enable output 9 connected to an enable input 10 of the filter 2, a set of control outputs 11 connected to a set of control inputs 12 of the PGC unit 4, and an enable output 13 connected to an enable input 14 of the PGC unit 4.

The operation of the arrangement according to the invention in connection with a training sequence will be described below.

A multitone signal sent out by an ADSL transceiver (not shown) will be received on the transmission line 1.

To start with, the enable outputs 9 and 13 of the DSP 6 are both low, which means that the received multitone signal will pass through the filter 2 and the PGC unit 4 directly to the A/D converter 5.

In the A/D converter 5, the received multitone signal is converted into a digital signal and supplied to the DSP 6.

In the DSP 6, the signal level of the highest and the lowest tone of the multitone signal are analyzed.

Normally, the highest tone has considerably lower signal strength than the lowest tone, and thereby also a lower SNR.

The DSP 6 sets its enable output 9 high. Hereby, the filter 2 is enabled for programming. Via the set of control outputs 7 of the DSP 6, the filter 2 is programmed such that the signal strengths of the highest tone and the lowest tone become equal. During the programming process, this is monitored by the DSP 6.

The enable output 9 of the DSP 6 is then again set low. Thereafter, the enable output 13 of the DSP 6 is set high, to enable the PGC unit 4 for programming.

Via the set of control outputs 11, the DSP 6 programs or adjusts the gain of the PGC 4 such that the total signal level from the PGC 4 coincides with the dynamic range of the A/D converter 5. During the programming process, this is monitored by the DSP 6.

Thereafter, the enable output 13 of the DSP 6 is again set low and the training sequence is terminated.

As should be apparent from the above, the SNR will now be equal at all frequencies, which means that the total number of bits that can be allocated to an ADSL frame will be higher and, consequently, that the bit rate will increase.

What is claimed is:

1. An arrangement for signal level adjustment of a multitone signal received over a transmission line during a training sequence in a digital subscriber line system, characterized in that it comprises a programmable high-pass filter (2) connected with its input terminal to the transmission line (1), a programmable gain control unit (4) connected with its input terminal to the output terminal of the high-pass filter (2), and with its output terminal to an input terminal of an analog-to-digital converter (5), a digital signal processor (6) connected with its input terminals to an output bus (15) of the analog-to-digital converter (5), with first control output terminals (7, 9) to control input terminals (8, 10) of the high-pass filter (2), and with second control output terminals (11, 13) to control input terminals (12, 14) of the programmable gain control unit (4), the digital signal processor (6) being adapted to detect a signal level difference between the highest and the lowest tone of the multitone signal and in response to the detected difference, program the high-pass filter (2) via its control input terminals (8, 10) to make the signal level of the highest tone equal to the signal level of the lowest tone, the digital signal processor (6) furthermore being adapted to program the programmable gain control unit (4) via its control input terminals (12, 14) to adjust the total signal level on its output terminals to coincide with the dynamic range of the analog-to-digital converter (5).

2. The arrangement as claimed in claim 1, characterized in that the input terminal of the programmable high-pass filter (2) is connected to the transmission line (1) via a preamplifier (3).

* * * * *